US012690408B2

(12) United States Patent (10) Patent No.: US 12,690,408 B2
Maruyama et al. (45) Date of Patent: Jul. 21, 2026

(54) SUBSTRATE PROCESSING APPARATUS AND METHOD FOR MANUFACTURING SEMICONDUCTOR DEVICE

(71) Applicant: Kioxia Corporation, Tokyo (JP)

(72) Inventors: Yosuke Maruyama, Yokkaichi Mie (JP); Takahiro Kawata, Yokkaichi Mie (JP); Satoshi Nakaoka, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 245 days.

(21) Appl. No.: 18/447,702

(22) Filed: Aug. 10, 2023

(65) Prior Publication Data

US 2024/0312802 A1 Sep. 19, 2024

(30) Foreign Application Priority Data

Mar. 14, 2023 (JP) ................................. 2023-039641

(51) Int. Cl.
H10P 72/00 (2026.01)
H10P 50/28 (2026.01)
H10P 72/76 (2026.01)

(52) U.S. Cl.
CPC ........ H10P 72/0426 (2026.01); H10P 50/283 (2026.01); H10P 72/7606 (2026.01); H10P 72/7618 (2026.01); *H10P 72/7621* (2026.01)

(58) Field of Classification Search
None
See application file for complete search history.

(56) References Cited

U.S. PATENT DOCUMENTS

| | | | | |
|---|---|---|---|---|
| 5,656,088 A * | 8/1997 | Sugimoto | ................. | B05C 3/04 |
| | | | | 118/423 |
| 5,853,496 A * | 12/1998 | Honda | .............. | H01L 21/67057 |
| | | | | 134/76 |
| 6,235,147 B1* | 5/2001 | Lee | ...................... | H01L 21/6708 |
| | | | | 156/345.23 |
| 2004/0129300 A1* | 7/2004 | Ohshimo | .......... | H01L 21/67057 |
| | | | | 134/61 |
| 2007/0181160 A1* | 8/2007 | Yi | ..................... | H01L 21/67326 |
| | | | | 134/25.1 |
| 2018/0082834 A1* | 3/2018 | Chen | ................. | H01L 21/67086 |

FOREIGN PATENT DOCUMENTS

| | | | | | |
|---|---|---|---|---|---|
| JP | S6197836 A | * | 5/1986 | ....... | H01L 21/67086 |
| JP | 2740594 B2 | | 4/1998 | | |
| JP | 2000-021831 A | | 1/2000 | | |
| JP | 2004-296660 A | | 10/2004 | | |

* cited by examiner

*Primary Examiner* — Keath T Chen
*Assistant Examiner* — Margaret Klunk
(74) *Attorney, Agent, or Firm* — Foley & Lardner LLP

(57) ABSTRACT

A substrate processing apparatus includes: a processing tank configured to store a solution capable of processing a substrate; a supply configured to supply the solution to the processing tank; a holding member having an openable and closable support portion capable of sandwiching the substrate, the holding member configured to hold the substrate in the processing tank; a first drive mechanism configured to move the holding member in a first direction along a substrate surface; and a guide disposed between the support portion and the supply in the processing tank and configured to guide a rotational movement of the substrate in the first direction.

10 Claims, 12 Drawing Sheets

*FIG. 6A*    *FIG. 6B*
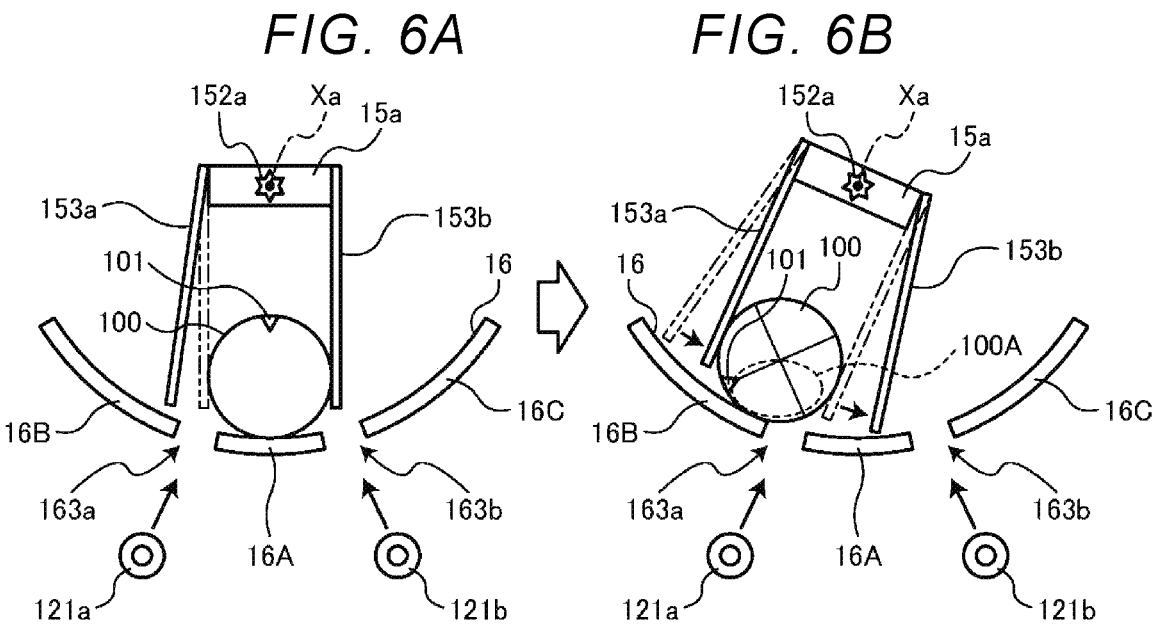
*FIG. 6C*
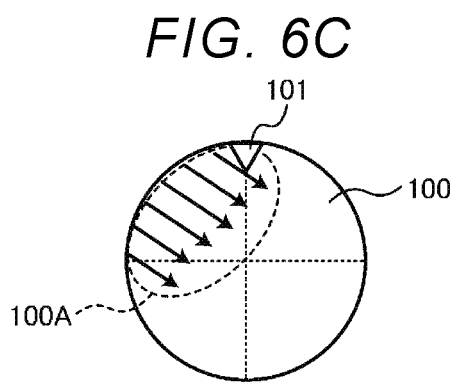
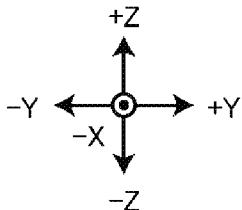

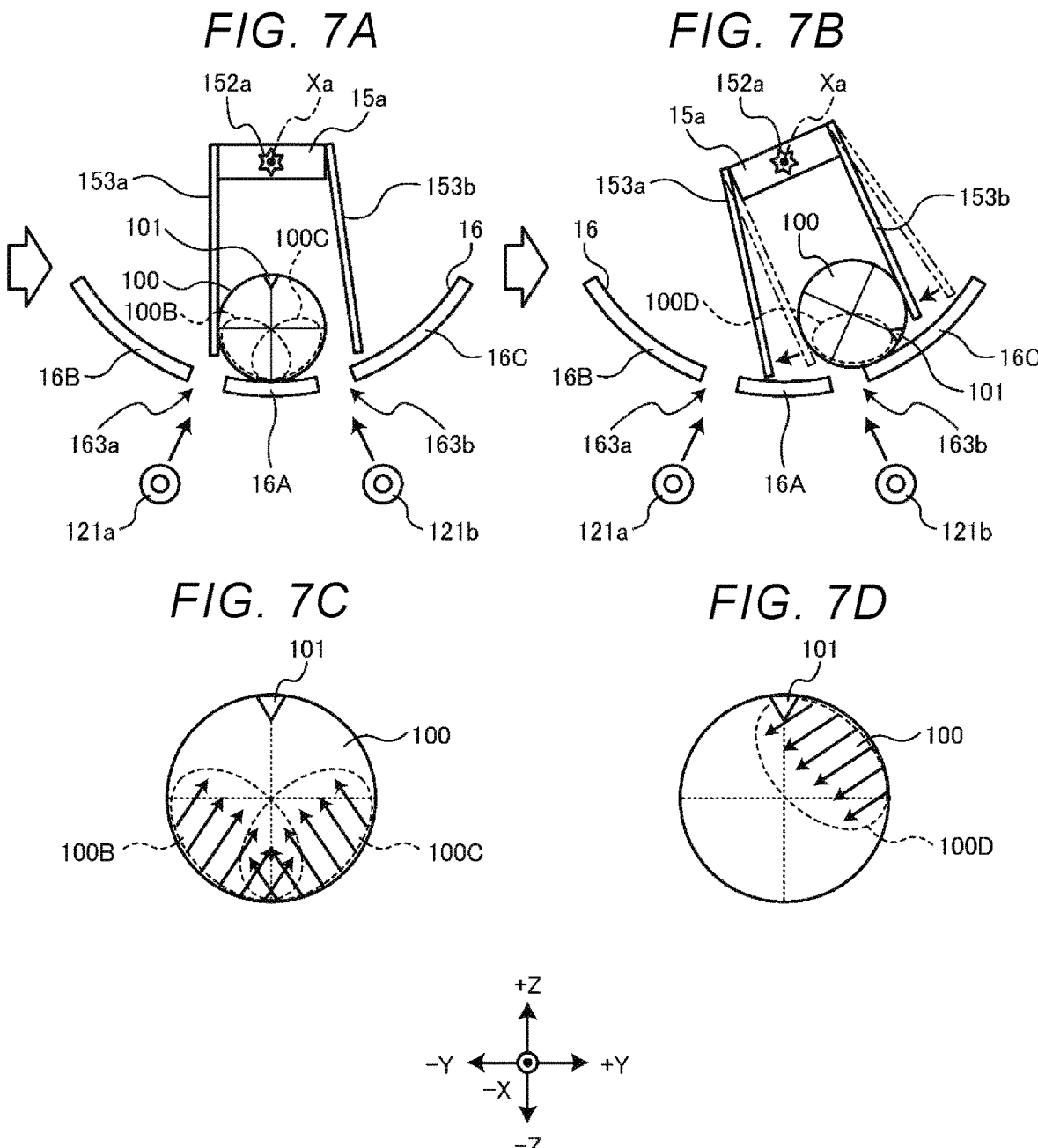

*FIG. 9*

FIG. 12A  FIG. 12B  FIG. 12C
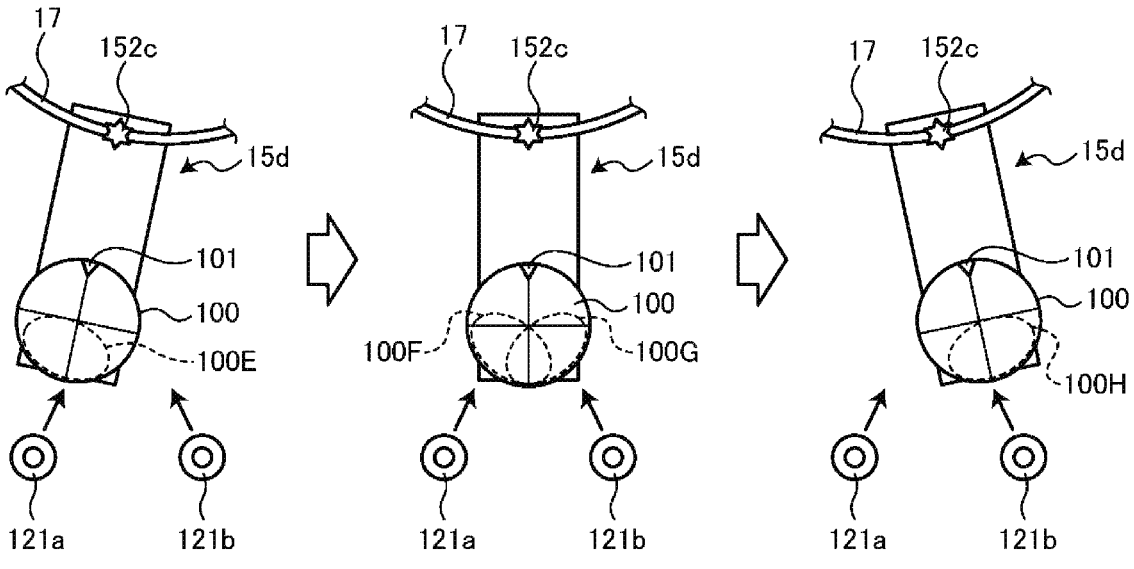
FIG. 12D  FIG. 12E  FIG. 12F
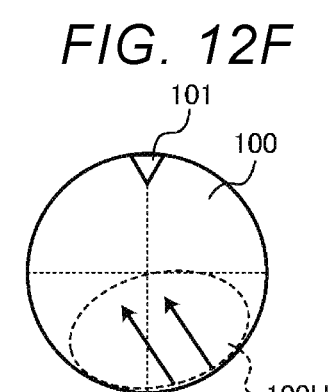
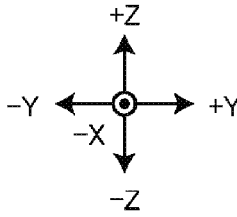

SUBSTRATE PROCESSING APPARATUS AND METHOD FOR MANUFACTURING SEMICONDUCTOR DEVICE

CROSS-REFERENCE TO RELATED APPLICATION

This application is based upon and claims the benefit of priority from Japanese Patent Application No. 2023-039641, filed Mar. 14, 2023, the entire contents of which are incorporated herein by reference.

FIELD

Embodiments described herein relate generally to a substrate processing apparatus and a method for manufacturing a semiconductor device.

BACKGROUND

In a semiconductor device manufacturing process or the like, a substrate processing apparatus performs collective etching with a plurality of substrates immersed in a chemical solution stored in a processing tank. In such a substrate processing apparatus, the chemical solution may be supplied from a specific part of the processing tank toward the substrate, and fluctuations in etching amount may occur in the plane of the substrate.

DESCRIPTION OF THE DRAWINGS

FIG. 1 is a diagram illustrating a configuration example of a substrate processing apparatus according to Embodiment 1.

FIG. 3 is a perspective view illustrating a detailed configuration example of a guide of the substrate processing apparatus according to Embodiment 1.

FIGS. 6A to 6C are diagrams partially illustrating the procedure of the substrate processing method according to Embodiment 1.

FIGS. 7A to 7D are diagrams partially illustrating the procedure of the method for manufacturing a semiconductor device according to Embodiment 1.

FIG. 9 is a perspective view illustrating a configuration example of a substrate processing apparatus according to Modification 2 of Embodiment 1.

FIGS. 12A to 12F are diagrams partially illustrating the procedure of a method for manufacturing a semiconductor device according to Embodiment 2.

DETAILED DESCRIPTION

Figure 2:
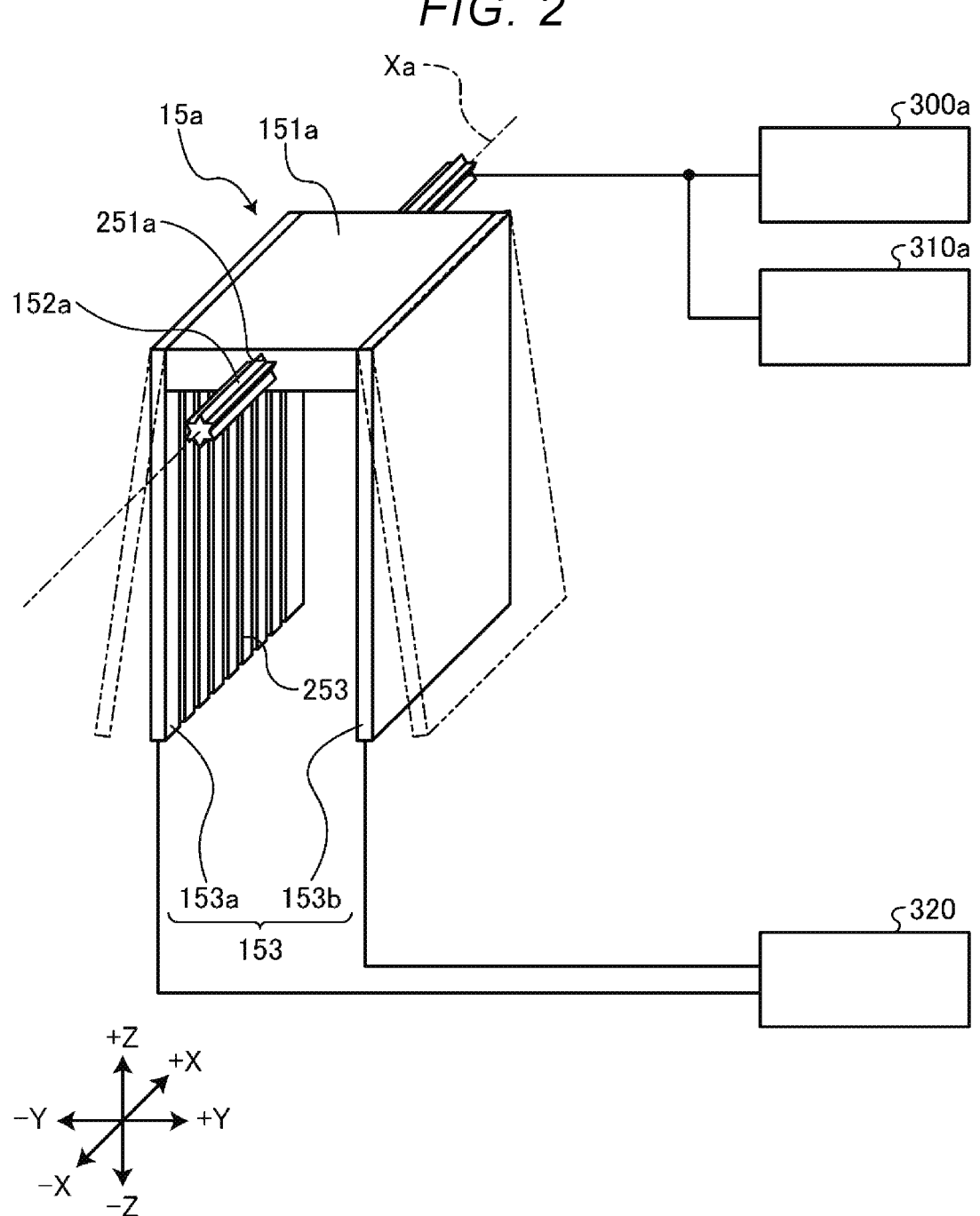
FIG. 2 is a perspective view illustrating a detailed configuration example of a lifter of the substrate processing apparatus according to Embodiment 1.

Embodiments provide a substrate processing apparatus and a method for manufacturing a semiconductor device enabling an improvement in in-plane etching amount uniformity.

In general, according to at least one embodiment, a substrate processing apparatus includes: a processing tank configured to store a solution capable of processing a substrate; a supply unit (supply) configured to supply the solution to the processing tank; a holding member having an openable and closable support portion capable of sandwiching the substrate, the holding member configured to hold the substrate in the processing tank; a first drive mechanism capable of moving the holding member in a first direction along a substrate surface; and a guide member (guide) disposed between the support portion and the supply unit in the processing tank and configured to guide a rotational movement of the substrate in the first direction.

Hereinafter, embodiments will be described in detail with reference to the drawings. It should be noted that the present disclosure is not limited by the following embodiments. In addition, components in the following embodiments include those that can be easily assumed by those skilled in the art or substantially identical components.

Figure 1:
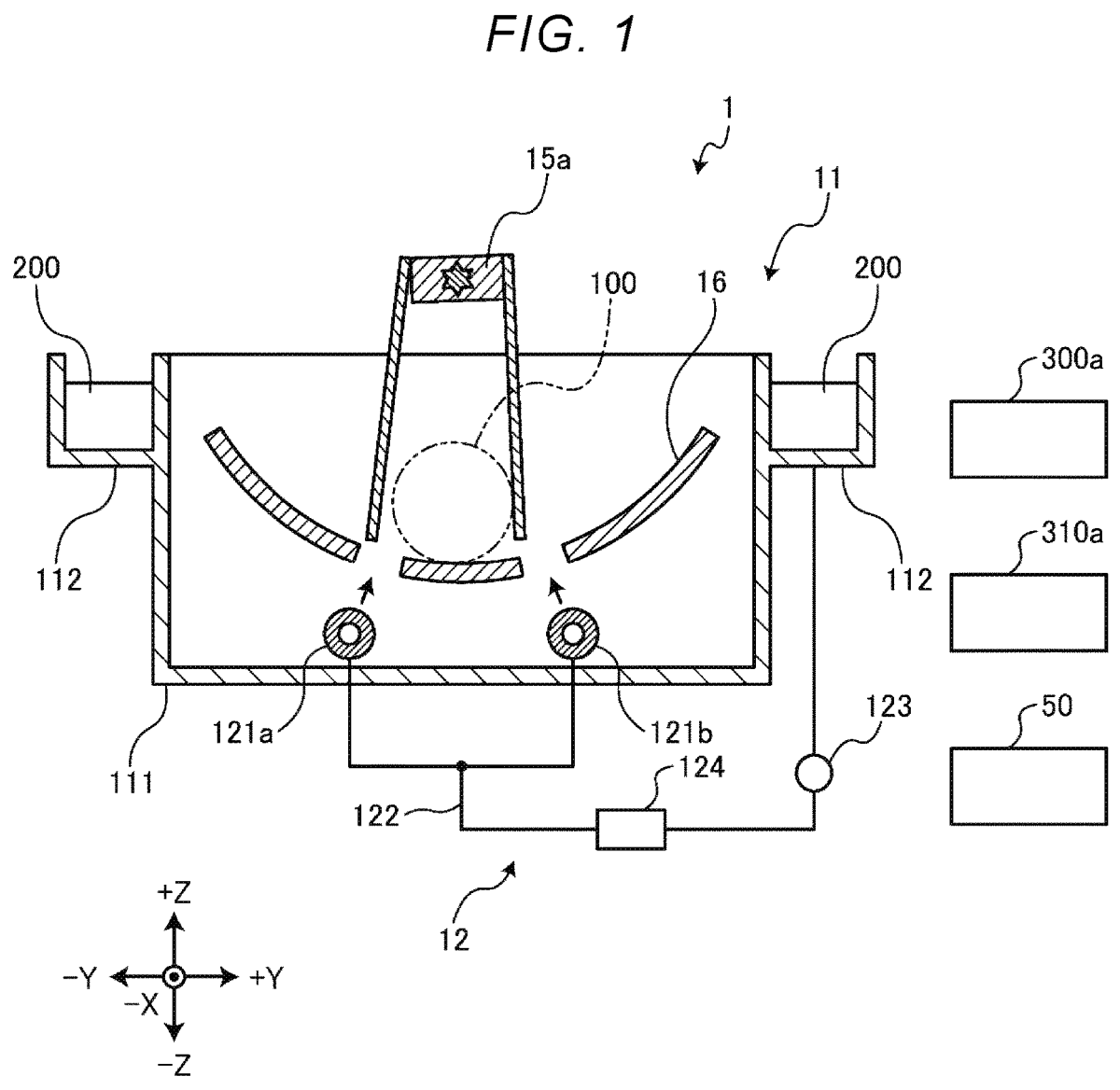

(Embodiment 1) (Configuration Example of Substrate Processing Apparatus) FIG. 1 is a diagram illustrating a configuration example of a substrate processing apparatus 1 according to an embodiment.

It should be noted that the Z direction in this specification is the up-down direction of a chemical solution tank 11, the upward direction is the positive Z direction, and the downward direction is the negative Z direction. The up-down direction of the chemical solution tank 11 is a third direction. In other words, the third direction is the Z direction. In addition, the X direction is the direction in which a substrate surface of a substrate 100 carried into the chemical solution tank 11 faces. The direction in which the substrate surface faces is a second direction. In other words, the second direction is the X direction. In addition, the X direction and the Z direction are mutually intersecting directions. The X direction and the Z direction may be orthogonal.

In addition, the Y direction in this specification is a direction along the substrate surface of the substrate 100 carried into the chemical solution tank 11 and intersecting the X direction and the Z direction. The direction along the substrate surface of the substrate 100 is a first direction. In other words, the first direction is the Y direction. The Y direction may be orthogonal to the X direction and the Z direction. At this time, the positive Y direction and the negative Y direction are defined such that the negative Y direction, the positive Z direction, the positive Y direction, and the negative Z direction are located clockwise when viewed from the negative X direction side.

The substrate 100 to be processed by the substrate processing apparatus 1 of the embodiment has, for example, a silicon nitride layer. The substrate processing apparatus 1 is configured as, for example, a batch-type wet etching apparatus that collectively immerses a plurality of the substrates 100 in a chemical solution 200 stored in the chemical solution tank 11 to selectively etch, for example, the silicon nitride layers formed on the substrates 100.

As illustrated in FIG. 1, the substrate processing apparatus 1 includes the chemical solution tank 11, a supply unit (supply) 12, a lifter 15a, a guide 16, a control unit 50, a first drive mechanism 300a, and a second drive mechanism 310a.

The chemical solution tank 11 is, for example, a container that stores the chemical solution 200 capable of processing the substrate 100. The chemical solution 200 is an example of a solution. The chemical solution tank 11 is an example of a solution tank. The chemical solution tank 11 has a processing tank 111 and an outer tank 112.

The processing tank 111 is configured to be capable of accommodating the lifter 15a holding the plurality of substrates 100. In other words, the processing tank 111 is capable of immersing the plurality of substrates 100 together with the lifter 15a in the stored chemical solution 200.

The outer tank 112 collects, for example, the chemical solution 200 that overflows from the processing tank 111. It should be noted that the collected chemical solution 200 is returned to the processing tank 111 by the supply unit 12.

The supply unit 12 supplies, for example, the chemical solution 200 returned from the outer tank 112 to the processing tank 111. The supply unit 12 has a pipe 122, a pump 123, a valve 124, and supply pipes 121a and 121b.

The pipe 122 is provided such that, for example, the chemical solution 200 communicates with a bottom portion of the outer tank 112 and a bottom portion of the processing tank 111. The pipe 122 connects the outer tank 112 and the supply pipes 121a and 121b, which are provided near the bottom portion of the processing tank 111, via the pump 123 and the valve 124. It should be noted that a filter may be provided at any position of the pipe 122.

The pump 123 suctions the chemical solution 200 from the outer tank 112, pressurizes the suctioned chemical solution 200 with a predetermined pressure, and delivers the solution toward the valve 124.

Figure 3:
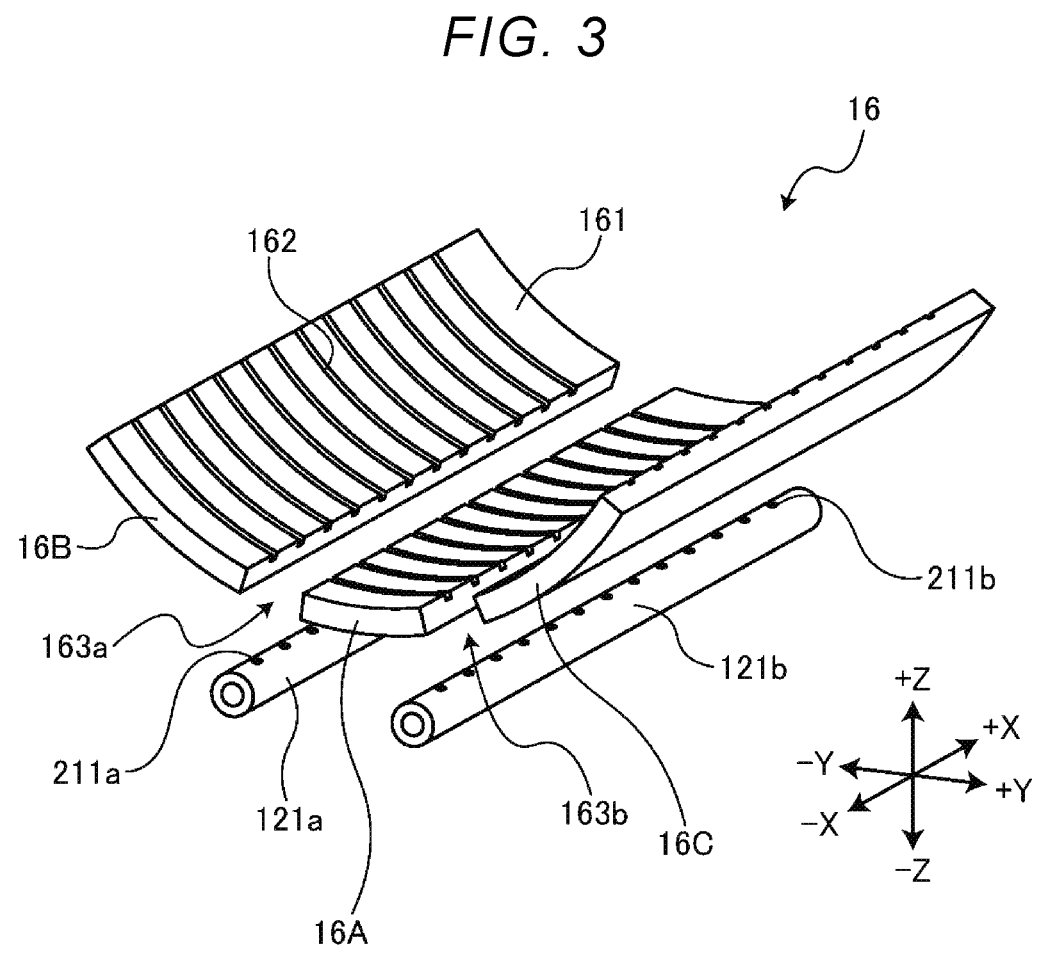

The supply pipes 121a and 121b supply, for example, the chemical solution 200 delivered from the valve 124 toward the substrate 100. The supply pipes 121a and 121b are respectively provided at the lower part of the processing tank 111 to be spaced from each other and extend in the X direction (FIG. 3). A plurality of supply ports 211a and 211b are formed side by side in the X direction on the side surfaces of the supply pipes 121a and 121b, respectively. The chemical solution 200 is discharged from the supply ports 211a and 211b toward each of the substrates 100 located in the X direction. When the chemical solution 200 discharged from the supply ports 211a and 211b is applied to the surface of the substrate 100 at a predetermined flow velocity, etching progresses in the region hit by the chemical solution 200.

The valve 124 is, for example, connected to the control unit 50 and regulates the flow rate of the chemical solution 200 delivered to each of the supply pipes 121a and 121b based on instructions from the control unit 50. As a result, the flow velocity of the chemical solution 200 discharged from the supply ports 211a and 211b is changed, and thus the etching intensity of the substrate 100 can be adjusted. It should be noted that the adjustment of the flow rate of the chemical solution 200 is not limited to this method and the flow rate of the chemical solution 200 may be adjusted by changing the output of the pump 123.

The control unit 50 controls, for example, each part of the substrate processing apparatus 1. The control unit 50 is configured as a computer including, for example, a central processing unit (CPU), a read only memory (ROM), and a random access memory (RAM), which are not illustrated, and controls the substrate processing apparatus 1 as a whole.

The first drive mechanism 300a and the second drive mechanism 310a are actuators including, for example, motors (not illustrated). The first drive mechanism 300a and the second drive mechanism 310a control the operation of the lifter 15a in accordance with instructions from the control unit 50.

Next, a detailed configuration example of the lifter 15a of the substrate processing apparatus 1 will be described with reference to FIG. 2. FIG. 2 is a perspective view illustrating the detailed configuration of the lifter 15a of the substrate processing apparatus 1 according to Embodiment 1.

The lifter 15a holds, for example, the plurality of substrates 100 and carries the plurality of held substrates 100 into and out of the processing tank 111. The substrates 100 carried into the processing tank 111 are disposed above the supply pipes 121a and 121b together with the lifter 15a. As illustrated in FIG. 2, the lifter 15a has a head portion 151a, a shaft portion 152a, and a support portion 153. It should be noted that the lifter 15a is an example of a holding member.

The head portion 151a is substantially plate-shaped when viewed from above. The head portion 151a has a polygonal hole 251a penetrating the central portion of the head portion 151a in the X direction. In addition, the head portion 151a supports the support portion 153 extending downward from the head portion 151a. The head portion 151a is quartz or the like.

The shaft portion 152a supports the head portion 151a by passing through the hole 251a. The shaft portion 152a has a polygonal cross section that can be fitted into the hole 251a. The shaft portion 152a is metal or the like. It should be noted that although the hole 251a and the shaft portion 152a are polygonal, the hole 251a and the shaft portion 152a may be of any shape insofar as the hole 251a and the shaft portion 152a are fittable.

The shaft center of the shaft portion 152a extends along a central axis Xa penetrating the head portion 151a in the X direction. The shaft portion 152a is connected to, for example, the first drive mechanism 300a and the second drive mechanism 310a. The shaft portion 152a can be rotated about the central axis Xa by the first drive mechanism 300a. In other words, by rotating the shaft portion 152a, the head portion 151a rotates about the central axis Xa. As a result, the support portion 153 is also rotatable about the central axis Xa. The first drive mechanism 300a adjusts the rotation angle, rotation direction, and rotation speed of the shaft portion 152a such that the support portion 153 can be repeatedly rotated in the processing tank 111.

In addition, the shaft portion 152a can be moved in the Z direction by the second drive mechanism 310a. By the shaft portion 152a moving in the Z direction, the head portion 151a and the support portion 153 are also movable in the Z direction. The second drive mechanism 310a adjusts the amount and speed of movement of the shaft portion 152a in the Z direction.

The support portion 153 holds, for example, the plurality of substrates 100 side by side. In other words, the support portion 153 allows the plurality of substrates 100 to stand upright and holds the plurality of substrates 100 from edge portions with the substrate surfaces of the adjacent substrates 100 facing each other. The support portion 153 has a support member 153a and a support member 153b as a pair of support members.

The support member 153a and the support member 153b are, for example, substantially plate-shaped when viewed from the Y direction. The support member 153a and the support member 153b respectively extend downward from both side surfaces of the head portion 151a in the Y direction and face each other. The support member 153a and the support member 153b spaced from each other in the Y direction in this manner support the substrate 100 so as to sandwich the substrate 100 from the positive and negative Y directions. Hereinafter, the support member 153a and the support member 153b supporting the substrate 100 so as to sandwich the substrate 100 may be referred to as "sandwiching".

In addition, on each of the facing surfaces of the support member 153a and the support member 153b, a plurality of recess portions 253 into which the edge portions of the substrates 100 can be inserted are formed along the Z direction. As a result, the substrate 100 is stably sandwiched between the support member 153a and the support member 153b. The support member 153a and the support member 153b are quartz or the like.

The support member 153a and the support member 153b respectively include, for example, a third drive mechanism 320. The support member 153a and the support member 153b can be opened and closed in the Y direction by the third drive mechanism 320. Specifically, for example, the support member 153a opens toward the negative Y direction and closes toward the positive Y direction. For example, the support member 153b opens toward the positive Y direction and closes in the negative Y direction. By opening at least one of the support member 153a and the support member 153b, the substrate 100 is released from the sandwiching.

The third drive mechanism 320 is an actuator including, for example, a motor (not illustrated). The third drive mechanism 320 controls the respective opening and closing operations of the support member 153a and the support member 153b in accordance with instructions from the control unit 50.

Next, a detailed configuration example of the guide 16 of the substrate processing apparatus 1 will be described with reference to FIG. 3. FIG. 3 is a perspective view illustrating the detailed configuration example of the guide 16 of the substrate processing apparatus 1 according to Embodiment 1.

At least a part of the guide 16 is provided between the lifter 15a carried into the processing tank 111 and the supply pipes 121a and 121b. The guide 16 is an example of a guide member.

As illustrated in FIG. 3, the guide 16 has, for example, a plurality of recess portions 162, which are formed along the Y direction on a facing surface 161 facing the support portion 153. As an example, the cross section of the facing surface 161 of the guide 16 along the Y direction has an arc shape that is recessed downward. Therefore, the edge portions of the substrates 100 can be inserted into the plurality of recess portions 162. As a result, the substrate 100 that is released from the sandwiching by the support portion 153 is capable of moving along the facing surface 161. In other words, the guide 16 guides the rotational movement of the substrate 100 that is released from the sandwiching by the support portion 153. In addition, a rolling body may be disposed in the recess portion 162 to assist in the movement of the substrate 100 in the Y direction. As a result, the substrate 100 can be easily moved in the Y direction. The guide 16 is quartz or the like. It should be noted that the plurality of recess portions 162 may not be formed.

The guide 16 has a left end portion 16B, a middle portion 16A, and a right end portion 16C in order from the negative Y direction when viewed in the X direction. The middle portion 16A corresponds to the position of the facing surface 161 that is most recessed downward. Preferably, the distance from the left end portion 16B to the right end portion 16C is equal to or greater than the length of the circumference of the substrate 100. As a result, the substrate 100 is capable of rotating at least once while moving along the facing surface 161.

In addition, the guide 16 has slits 163a and 163b penetrating the guide 16 in the up-down direction and extending in the X direction. The slits 163a and 163b are provided at positions corresponding to the supply pipes 121a and 121b, respectively. For example, the chemical solution 200 that is discharged from the supply pipes 121a and 121b is supplied to the substrate 100 that moves on the facing surface 161 through the slits 163a and 163b.

(Method for manufacturing a semiconductor device)

Next, a method for manufacturing a semiconductor device of Embodiment 1 will be described with reference to FIGS. 4 to 7. The semiconductor device of Embodiment 1 is, for example, a three-dimensional nonvolatile memory in which memory cells are disposed three-dimensionally.

Figure 4A:
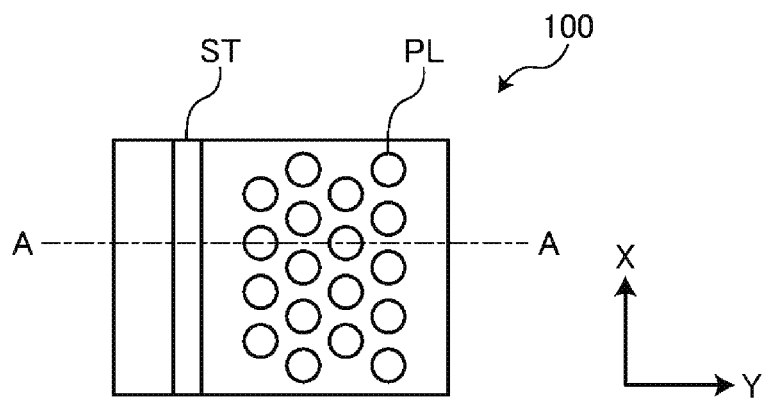
FIGS. 4A and 4B are diagrams partially illustrating the procedure of a method for manufacturing a semiconductor device according to Embodiment 1.
Figure 4B:
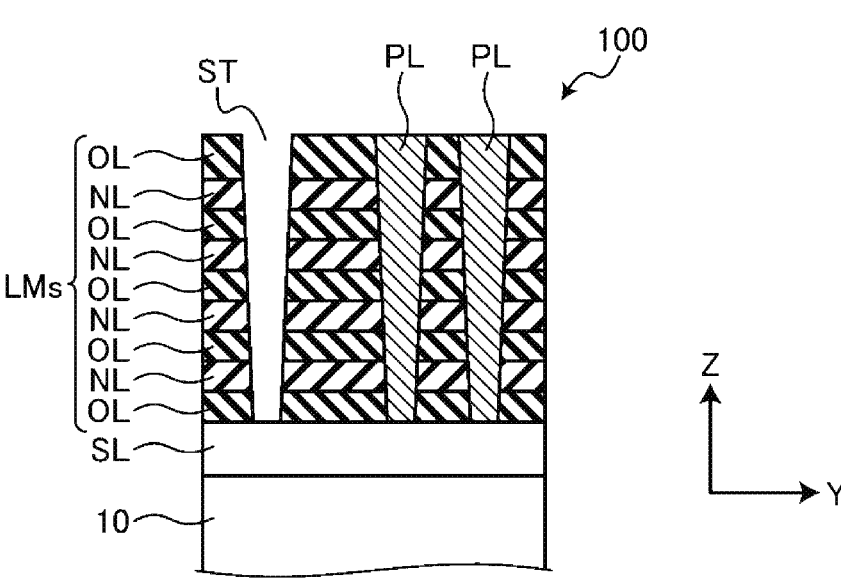
Figure 5A:
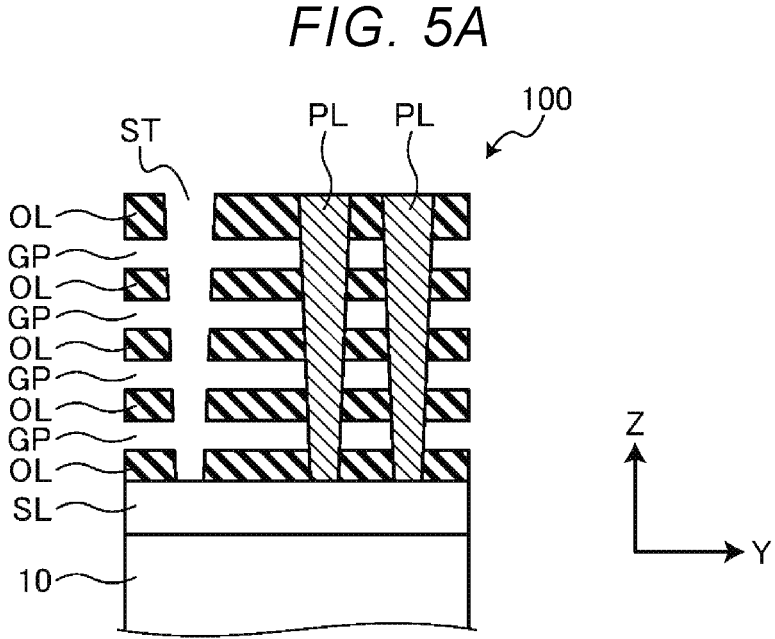
FIGS. 5A and 5B are diagrams partially illustrating the procedure of a substrate processing method according to Embodiment 1.
Figure 5B:
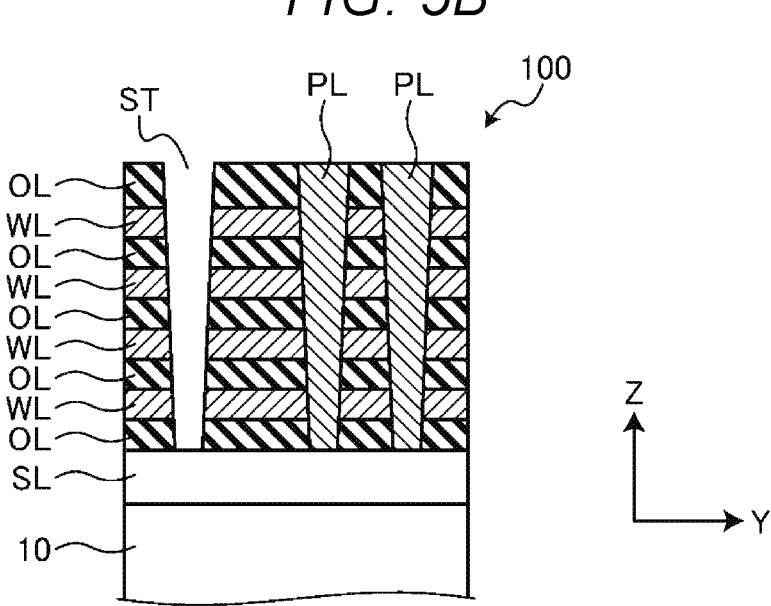

FIGS. 4A to 5B are diagrams partially illustrating the procedure of the method for manufacturing a semiconductor device according to Embodiment 1. FIG. 4A is a top view illustrating a part of the substrate 100 that is formed with a silicon nitride layer NL, which is a first insulating layer to be etched. In addition, FIGS. 4B, 5A, and 5B are cross-sectional views of the substrate 100 in FIG. 4A taken along line A-A.

As illustrated in FIG. 4A, the substrate 100 is formed with a slit ST and a plurality of memory layers PL when viewed from the Z direction. In addition, as illustrated in FIG. 4B, the substrate 100 is formed with an insulating layer 10 covering a peripheral circuit including, for example, a transistor and wiring, which are not illustrated. A source line SL is formed on the insulating layer 10. In addition, a stacked body LMs is formed on the source line SL.

In the stacked body LMs, a plurality of the silicon nitride layers NL and a plurality of silicon oxide layers OL as second insulating layers are alternately stacked one by one. The slit ST and the plurality of memory layers PL extend upward and downward in the stacked body LMs.

Subsequently, as illustrated in FIG. 5A, the silicon nitride layer NL of the stacked body LMs is removed by etching in the substrate processing apparatus 1. Specifically, the silicon nitride layer NL is removed by the chemical solution 200 infiltrating into the stacked body LMs from the slit ST. Then, a gap GP is formed at the part where the silicon nitride layer NL is removed.

Then, as illustrated in FIG. 5B, a conductive film containing, for example, tungsten (W) is formed in the formed gap GP. A part of this conductive film functions as a word line WL. As a result of the above, the semiconductor device manufacturing in the substrate processing apparatus 1 is completed.

Next, the process of removing the silicon nitride layer NL of the stacked body LMs illustrated in FIGS. 4B and 5A by etching in the substrate processing apparatus 1 described above will be described.

FIGS. 6A to 7D are diagrams partially illustrating the procedure of a substrate processing method according to Embodiment 1. FIGS. 6A, 6B, 7A, and 7B are diagrams sequentially illustrating the processing from when the substrate 100 is carried into the processing tank 111 to when the etching is completed. In addition, FIGS. 6C, 7C, and 7D are conceptual diagrams respectively and schematically illustrating the directions in which the chemical solution 200 supplied from the supply pipes 121a and 121b hits the substrate 100 and the regions where the etching progresses in the processing of FIGS. 6B, 7A, and 7B, respectively. It should be noted that for convenience of description, the configuration of a part such as the chemical solution tank 11 is not illustrated.

Each of the plurality of substrates 100 has a notch portion 101. As illustrated in FIG. 6A, the control unit 50 carries the plurality of substrates 100 sandwiched by the support portion 153 into the processing tank 111. At this time, for example, the support portion 153 sandwiches the substrates 100 such that the notch portions 101 face upward.

Next, the control unit 50 opens the support member 153a of the support portion 153. The control unit 50 rotates the shaft portion 152a about the central axis Xa to rotate the support portion 153 toward the negative Y direction. As a result, the substrate 100 sandwiched by the support portion 153 is released from the sandwiching and pushed out in the negative Y direction by the support member 153b that is closed. The substrate 100 pushed out in the negative Y direction moves in the negative Y direction while rotating along the facing surface 161 of the guide 16.

It should be noted that the processing tank 111 stores, for example, high-temperature hot phosphoric acid as the chemical solution 200 capable of processing the silicon nitride layer NL. In addition, the chemical solution 200 that is discharged from the supply pipes 121a and 121b is supplied toward the substrates 100 at a predetermined flow velocity through the slits 163a and 163b of the guide 16.

As illustrated in FIG. 6B, the substrate 100 moves up to, for example, the left end portion 16B of the guide 16. More specifically, for example, the substrate 100 moves up to a position where the notch portion 101 of the substrate 100 and the left end portion 16B of the guide 16 face each other. The control unit 50 closes the support member 153a and opens the support member 153b. Then, the control unit 50 rotates the shaft portion 152a about the central axis Xa to rotate the support portion 153 toward the positive Y direction. As a result, the substrate 100 is pushed out in the positive Y direction by the support member 153a that is closed. The substrate 100 pushed out in the positive Y direction moves in the positive Y direction while rotating along the facing surface 161 of the guide 16.

At this time, a region 100A of the substrate 100 facing the supply pipe 121a across the slit 163a is supplied with the chemical solution 200 from the supply pipe 121a in the direction of the arrows in FIG. 6C. As a result, etching progresses in the region 100A.

Then, as illustrated in FIG. 7A, the substrate 100 moves up to, for example, the middle portion 16A of the guide 16. More specifically, for example, the substrate 100 moves until the notch portion 101 of the substrate 100 is positioned upward. Regions 100B and 100C of the substrate 100 facing the supply pipes 121a and 121b across the slits 163a and 163b are supplied with the chemical solution 200 from the supply pipes 121a and 121b in the directions of the arrows in FIG. 7C. As a result, etching progresses in the regions 100B and 100C.

Further, as illustrated in FIG. 7B, the substrate 100 moves up to, for example, the right end portion 16C of the guide 16. More specifically, for example, the substrate 100 moves up to a position where the notch portion 101 of the substrate 100 and the right end portion 16C of the guide 16 face each other. A region 100D of the substrate 100 facing the supply pipe 121b across the slit 163b is supplied with the chemical solution 200 from the supply pipe 121b in the direction of the arrows in FIG. 7D. As a result, etching progresses in the region 100D.

When the substrate 100 moves up to the right end portion 16C of the guide 16, the control unit 50 closes the support member 153b and opens the support member 153a toward the negative Y direction. The shaft portion 152a is rotated about the central axis Xa. As a result, the substrate 100 moves again toward the negative Y direction.

At this time, the control unit 50 may adjust the rotation speed of the support portion 153 by changing the rotation speed of the shaft portion 152a. At a lower rotation speed of the support portion 153, the chemical solution 200 hits a predetermined region of the substrate 100 for a longer period of time. Therefore, the rotation speed may be lowered in the region of the substrate 100 that the chemical solution 200 is unlikely to hit. As a result, etching uniformity can be adjusted by etching progressing in a predetermined region.

In addition, the control unit 50 may adjust the distance between the substrate 100 sandwiched by the support portion 153 and the supply pipes 121a and 121b by changing the position of the shaft portion 152a in the Z direction. As a result, the force with which the chemical solution 200 hits the surface of the substrate 100 is changed, and thus etching uniformity can be adjusted. It should be noted that at this time, the position of the guide 16 in the Z direction also changes as the position of the shaft portion 152a changes.

In addition, the control unit 50 may change the position of the shaft portion 152a in the Z direction when the substrate 100 is pushed out in the positive and negative Y directions by the support members 153a and 153b. For example, the control unit 50 increases the height of the lifter 15a when the support members 153a and 153b push out the substrate 100 in the positive and negative Y directions. As a result, the area of contact between the edge portion of the substrate 100 and the support members 153a and 153b decreases, and thus the friction between the substrate 100 and the support members 153a and 153b can be reduced and the substrate 100 can be rotationally moved more efficiently.

In addition, the control unit 50 may control the valve 124 to adjust the flow rate of the chemical solution 200 based on the position of the substrate 100. As illustrated in FIGS. 6A to 7D, the substrate 100 moves along the guide 16 formed in an arc shape, and thus the distance from the supply pipes 121a and 121b may differ when the substrate 100 is positioned in the middle portion 16A of the guide 16 and when the substrate 100 is positioned in the left end portion 16B or the right end portion 16C. Therefore, for example, when the substrate 100 is positioned in the left end portion 16B or the right end portion 16C far from the supply pipes 121a and 121b, the control unit 50 may execute control to increase the flow rate of the chemical solution 200. As a result, the hitting intensity of the chemical solution 200 with respect to the substrate 100 can be made equal, and thus etching uniformity can be improved.

By repeating the above processing, etching progresses uniformly in the plane of the substrate 100.

The etching of the silicon nitride layer NL in the substrate processing apparatus 1 is completed as a result of the above.

The substrate processing apparatus 1 of Embodiment 1 includes the processing tank 111, the supply unit 12 supplying the chemical solution 200 into the processing tank 111 from the supply pipes 121a and 121b, the lifter 15a allowing the plurality of substrates 100 to stand upright above the supply pipes 121a and 121b and holding the substrate surfaces of the adjacent substrates 100 to face each other, and the first drive mechanism 300a capable of moving the lifter 15a along the substrate surfaces. The lifter 15a has the support portion 153 capable of sandwiching the substrates 100, and the support portion 153 can be opened and closed. Further, the substrate processing apparatus 1 has the guide 16 guiding the rotational movement in the direction along the substrate surface of the substrate 100 released from the sandwiching by opening the support member 153*a* or 153*b*, which is a part of the support portion 153.

As a result, the substrate 100 can be rotationally moved on the guide 16, and thus an equal progress of etching is possible from the entire circumferential direction of the substrate 100. As a result, in-plane etching uniformity can be improved.

Figure 8:
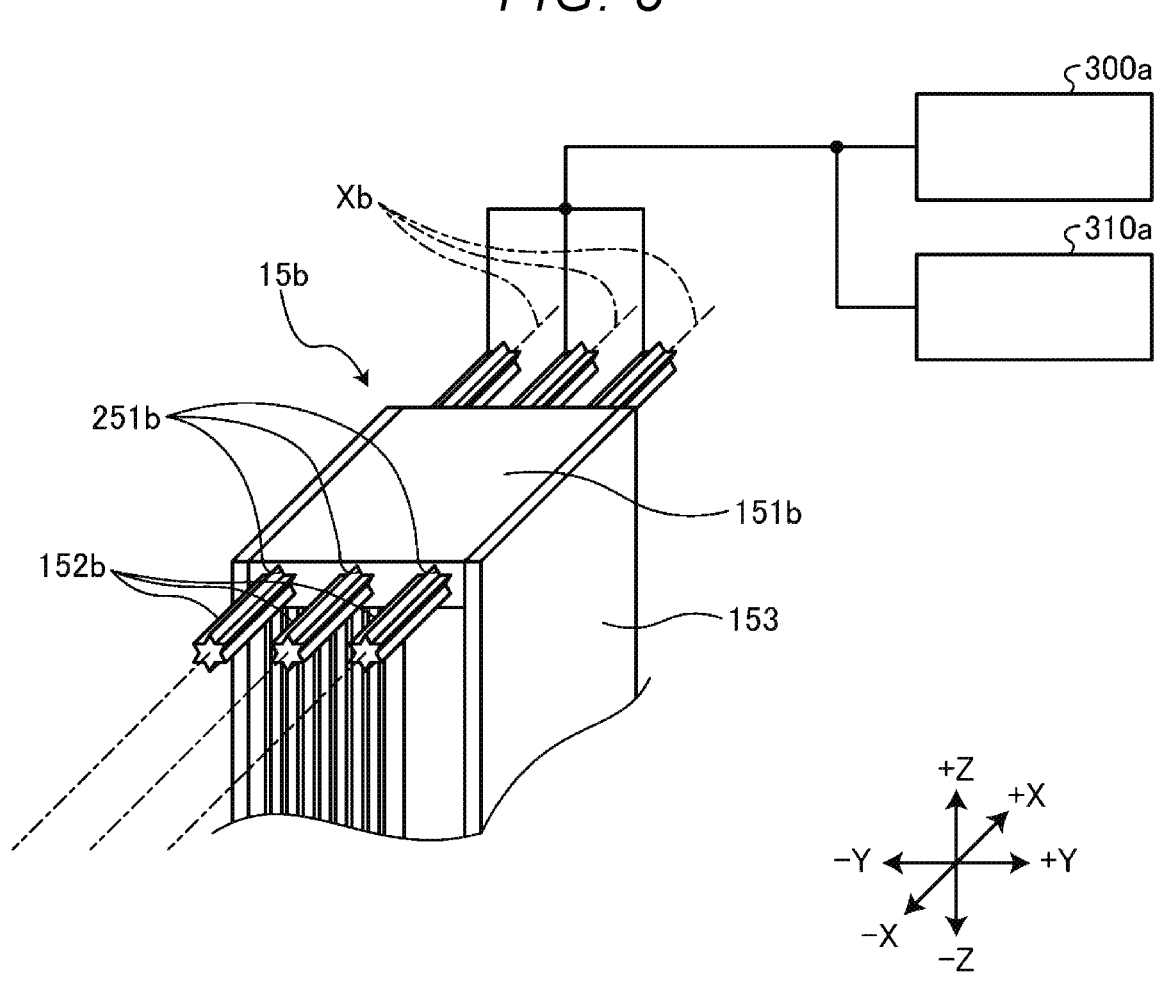
FIG. 8 is a perspective view illustrating a configuration example of a substrate processing apparatus according to Modification 1 of Embodiment 1.

(Modification 1) A substrate processing apparatus according to Modification 1 of the embodiment will be described with reference to FIG. 8. FIG. 8 is a perspective view illustrating a configuration example the substrate processing apparatus according to Modification 1 of Embodiment 1. The substrate processing apparatus of Modification 1 differs from the substrate processing apparatus of Embodiment 1 described above in that a plurality of shaft portions extend through a head portion 151*b* of a lifter 15*b*.

It should be noted that in the following description, configurations similar to those of Embodiment 1 described above are denoted by similar reference numerals and descriptions thereof may be omitted.

As illustrated in FIG. 8, the head portion 151*b* of the lifter 15*b* has a plurality of holes 251*b* penetrating the head portion 151*b* in the X direction.

A plurality of shaft portions 152*b* support the head portion 151*b* by respectively passing through the plurality of holes 251*b* of the head portion 151*b*.

The shaft center of each shaft portion 152*b* extends along a central axis Xb penetrating the head portion 151*b* in the X direction. Each shaft portion 152*b* is configured to be rotatable about the central axis Xb. Since the plurality of shaft portions 152*b* support the head portion 151*b* in this manner, the support portion 153 can be rotated stably.

It should be noted that although three holes 251*b* penetrate the head portion 151*b* in Modification 1 of Embodiment 1, the number is not limited thereto. In other words, the shaft portions and the holes are not limited in number insofar as the shaft portions passing through the respective holes 251*b* are controlled synchronously.

With the substrate processing apparatus and method for manufacturing a semiconductor device of Modification 1, other effects similar to those of the substrate processing apparatus 1 of the embodiment described above can be obtained.

Figure 9:
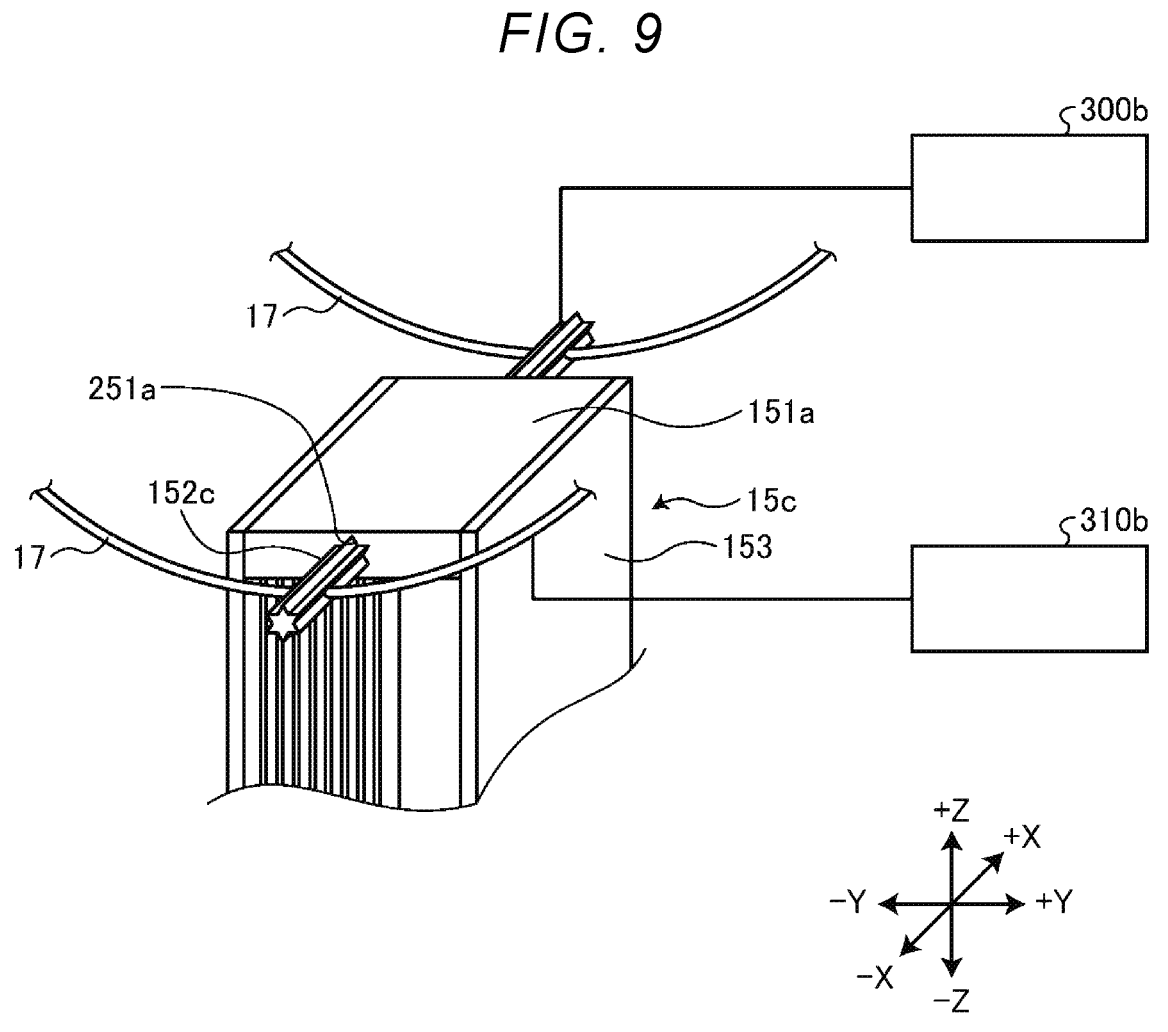

(Modification 2) A substrate processing apparatus according to Modification 2 of the embodiment will be described with reference to FIG. 9. FIG. 9 is a diagram illustrating a configuration example of the substrate processing apparatus according to Modification 2 of Embodiment 1. The substrate processing apparatus of Modification 2 differs from the substrate processing apparatus of Embodiment 1 described above in that the substrate processing apparatus of Modification 2 has rail members 17 and a shaft portion 152*c* of a lifter 15*c* moves along the rail members 17.

It should be noted that in the following description, configurations similar to those of Embodiment 1 described above are denoted by similar reference numerals and descriptions thereof may be omitted.

As illustrated in FIG. 9, the substrate processing apparatus according to Modification 2 includes the rail members 17. The rail members 17 are provided above the lifter 15*c* carried into the processing tank 111. The rail member 17 is formed in an arc shape that bulges downward along the substrate surface of the substrate 100 held by the lifter 15*c*. The rail member 17 supports the shaft portion 152*c* of the lifter 15*c* by penetrating the shaft portion 152*c*.

The shaft portion 152*c* of the lifter 15*c* includes a first drive mechanism 300*b* and is configured to be movable along the rail member 17. By moving the shaft portion 152*c* along the rail member 17, the lifter 15*c* can be moved in an arc shape. As a result, the shaft portion 152*c* does not have to be rotated, and thus rotation-attributable burden on each member can be reduced.

The rail member 17 is configured to be movable in the Z direction by a second drive mechanism 310*b*. By the rail member 17 moving in the Z direction, the head portion 151*a* and the support portion 153 are also movable in the Z direction.

With the substrate processing apparatus and method for manufacturing a semiconductor device of Modification 2, other effects similar to those of the substrate processing apparatus 1 of the embodiment described above can be obtained.

(Embodiment 2) Embodiment 2 will be described with reference to FIGS. 10 to 12. A substrate processing apparatus of Embodiment 2 differs from the substrate processing apparatus of Embodiment 1 described above in that the guide 16 is not provided in the processing tank 111.

It should be noted that in the following description, configurations similar to those of Embodiment 1 described above are denoted by similar reference numerals and descriptions thereof may be omitted.

Figure 10:
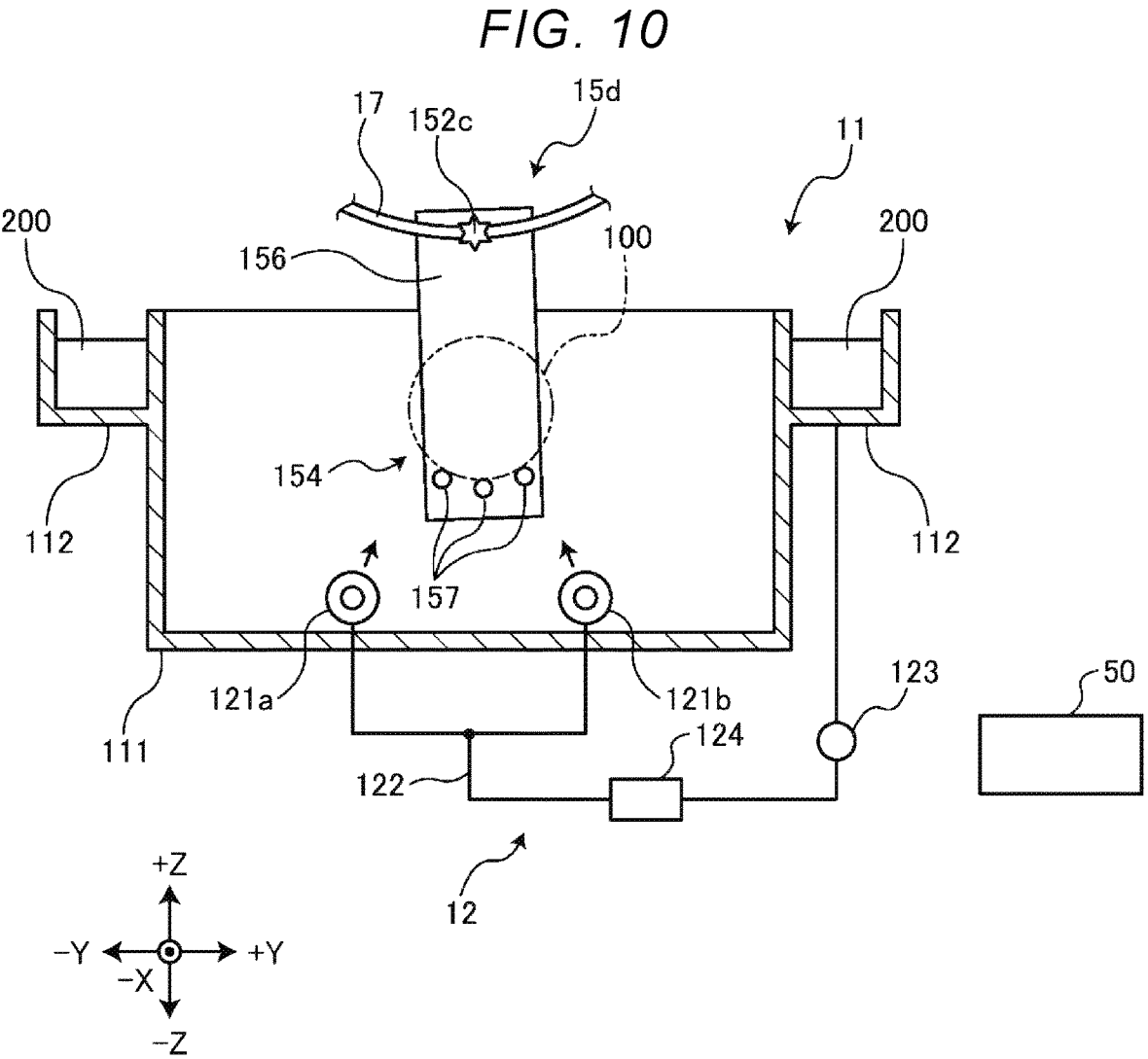
FIG. 10 is a diagram illustrating a configuration example of a substrate processing apparatus according to Embodiment 2.

(Configuration Example of Substrate Processing Apparatus) FIG. 10 is a diagram illustrating a configuration example of the substrate processing apparatus according to Embodiment 2. In addition, FIG. 11 is a perspective view illustrating a detailed configuration example of a lifter 15*d* of the substrate processing apparatus according to Embodiment 2.

As illustrated in FIG. 10, the substrate processing apparatus of Embodiment 2 includes the lifter 15*d* and the rail members 17.

Figure 11:
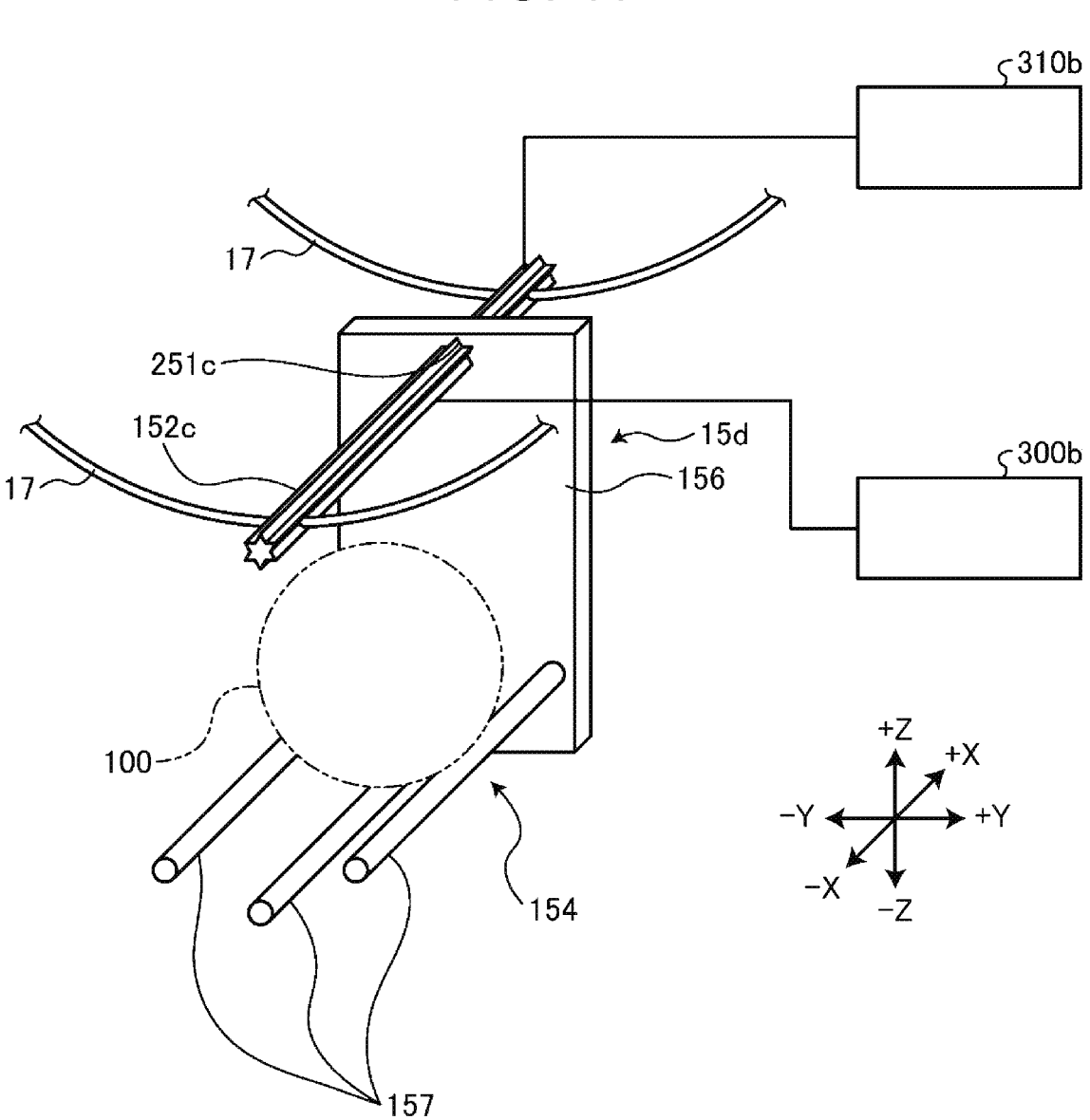
FIG. 11 is a perspective view illustrating a detailed configuration example of a lifter of the substrate processing apparatus according to Embodiment 2.

In addition, as illustrated in FIG. 11, the lifter 15*d* has the shaft portion 152*c* and a holding portion 154.

The holding portion 154 supports, for example, the substrate 100. The holding portion 154 has a plate-shaped portion 156 and protrusion portions 157.

The plate-shaped portion 156 is substantially plate-shaped when viewed in the X direction. The plate-shaped portion 156 has a polygonal hole 251*c* penetrating the upper portion of the plate-shaped portion 156 in the X direction. The plurality of protrusion portions 157 protruding toward the negative X direction are connected to the lower portion of the plate-shaped portion 156.

In addition, the shaft portion 152*c* passes through the hole 251*c* of the plate-shaped portion 156. The shaft portion 152*c* supports the holding portion 154 by passing through the hole 251*c* of the plate-shaped portion 156.

The protrusion portion 157 protrudes from the surface of the plate-shaped portion 156 facing the negative X direction and is formed in, for example, a rod shape. On the side surface of the protrusion portion 157, a recess portion (not illustrated) into which the edge portion of the substrate 100 can be inserted is formed along the Y direction. As a result, the substrates 100 stand upright and are held by the holding portion 154 in a state where the substrate surfaces of the adjacent substrates 100 face each other. The plate-shaped portion 156 and the protrusion portions 157 are quartz or the like.

The control unit 50 controls the first drive mechanism 300*b* to operate the shaft portion 152*c* and move the lifter 15*d* along the rail member 17. As a result, the lifter 15*d* can be moved in an arc shape.

(Method for manufacturing a semiconductor device) A method for manufacturing a semiconductor device of Embodiment 2 will be described with reference to FIGS. 12A to 12F.

FIG. 12A to 12F is a diagram partially illustrating the procedure of the method for manufacturing a semiconductor device according to Embodiment 2. It should be noted that the processing illustrated in FIGS. 4A to 5B of Embodiment 1 described above is also performed in the method for manufacturing a semiconductor device of Embodiment 2.

FIGS. 12A to 12C are diagrams sequentially illustrating the processing from when the substrate 100 is carried into the processing tank 111 to when etching is completed in a substrate processing method according to Embodiment 2. In addition, FIGS. 12D to 12F are conceptual diagrams respectively and schematically illustrating the directions in which the chemical solution 200 supplied from the supply pipes 121a and 121b hits the substrate 100 and the regions where the etching progresses in the processing of FIGS. 12A to 12C, respectively. It should be noted that for convenience of description, the configuration of a part such as the chemical solution tank 11 is not illustrated.

As illustrated in FIG. 12A, the control unit 50 moves the lifter 15d carried into the processing tank 111 toward the negative Y direction. The lifter 15d holds the plurality of substrates 100 such that, for example, each notch portion 101 faces upward. When the lifter 15d moves toward the negative Y direction, a region 100E of the substrate 100 facing the supply pipe 121a is supplied with the chemical solution 200 from the supply pipe 121a in, for example, the direction of the arrows in FIG. 12D. As a result, etching progresses in the region 100E.

Next, as illustrated in FIG. 12B, the control unit 50 moves the lifter 15d toward the positive Y direction. Then, regions 100F and 100G of the substrate 100 facing the supply pipes 121a and 121b are supplied with the chemical solution 200 in, for example, the directions of the arrows in FIG. 12E. As a result, etching progresses in the regions 100F and 100G.

Further, as illustrated in FIG. 12C, the control unit 50 further moves the lifter 15d toward the positive Y direction. A region 100H of the substrate 100 facing the supply pipe 121b is supplied with the chemical solution 200 in, for example, the direction of the arrows in FIG. 12F. As a result, etching progresses in the region 100H.

It should be noted that at this time, the control unit 50 may adjust the speed of movement of the lifter 15d by controlling the first drive mechanism 300b. At a lower movement speed of the lifter 15d, the chemical solution 200 hits a predetermined region of the substrate 100 for a longer period of time. Therefore, the speed of the lifter 15d may be lowered in a predetermined region of the substrate 100 that the chemical solution 200 is unlikely to hit. As a result, etching is capable of progressing in the predetermined region. In this manner, etching uniformity can be adjusted.

In addition, the control unit 50 may change the position of the rail member 17 in the Z direction by controlling the second drive mechanism 310b. As a result, the substrate 100 can be brought closer to the supply pipes 121a and 121b. As a result, the hitting intensity of the chemical solution 200 with respect to the substrate 100 increases, and thus etching is capable of progressing. In addition, the substrate 100 can be kept away from the supply pipes 121a and 121b. As a result, the hitting intensity of the chemical solution 200 with respect to the substrate 100 decreases, and thus an excessive progress of etching can be prevented. In this manner, etching uniformity can be adjusted.

The substrate processing apparatus of Embodiment 2 includes the processing tank 111, the supply unit 12 supplying the chemical solution 200 into the processing tank 111 from the supply pipes 121a and 121b, the lifter 15d allowing the plurality of substrates 100 to stand upright above the supply pipes 121a and 121b and holding the substrate surfaces of the adjacent substrates 100 to face each other, the rail member 17 disposed above the lifter 15d and formed in an arc shape about the central axis extending in the direction in which the substrate surface faces, and the first drive mechanism 300b capable of moving the lifter 15d along the rail member 17.

As a result, an equal progress of etching is possible from the circumferential direction of the substrate 100. As a result, in-plane etching uniformity can be improved.

In addition, the lifter 15d is movable in an arc shape by following the rail member 17. Therefore, the shaft portion 152c does not have to be rotated, and thus burden on each member can be reduced.

With the substrate processing apparatus and method for manufacturing a semiconductor device of Embodiment 2, other effects similar to those of the substrate processing apparatus 1 of Embodiment 1 described above can be obtained.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate processing system comprising:
a substrate;
a processing tank configured to store a solution capable of processing the substrate;
a supply configured to supply the solution to the processing tank;
a lifter having an openable and closable support portion capable of sandwiching the substrate, the lifter configured to hold the substrate in the processing tank;
a first motor configured to move the lifter in a first direction that is aligned with a major surface of the substrate; and
a guide disposed between the support portion and the supply in the processing tank and configured to guide a rotational movement of the substrate;
wherein the guide has a first guide, a second guide, and a third guide between the first guide and the second guide, and wherein a distance from a left end portion of the first guide to a right end portion of the second guide is equal to or greater than a length of a circumference of the substrate, so as to rotate the substrate at least once.

2. The substrate processing system according to claim 1, wherein the lifter further has a shaft portion and a head portion supported by the shaft portion, and the support portion has a pair of support members extending downward from the head portion.

3. The substrate processing system according to claim 2, further comprising a third motor configured to open and close the pair of support members.

4. The substrate processing system according to claim 1, wherein the supply has a supply port configured to discharge the solution, the supply port configured to increase a flow rate of the solution as a distance from the substrate to the supply port increases.

5. The substrate processing system according to claim 1, wherein a cross section of the guide along a plane including a third direction and the first direction is formed in an arc shape recessed downward, the third direction intersecting the first direction and a second direction.

6. The substrate processing system according to claim 1, wherein a recess portion extending along a direction of movement of the substrate is disposed on a surface of the guide facing the support portion.

7. The substrate processing system according to claim 1, further comprising a second motor configured to move the lifter in a third direction intersecting both of the first direction and a second direction intersecting the first direction.

8. The substrate processing system according to claim 1, wherein the supply has a supply port configured to discharge the solution, and the guide has a slit penetrating the guide at a position above a corresponding supply port.

9. The substrate processing system according to claim 1, wherein the supply has a supply port configured to discharge the solution, and a space between the first guide and the second guide corresponds to a position above the supply port.

10. The substrate processing system according to claim 1, wherein the first motor is configured to reduce a movement speed of the lifter as a distance from the substrate to the supply port increases.

* * * * *